(12) United States Patent
Ban (10) Patent No.: US 7,088,282 B1
(45) Date of Patent: Aug. 8, 2006

(54) SYSTEM AND METHOD FOR PROGRAMMABLE HIGH PRECISION QUANTIZATION OF ANALOG VARIABLE

(75) Inventor: Oliver Keren Ban, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/149,313

(22) Filed: Jun. 9, 2005

(51) Int. Cl.
 *H03M 1/12* (2006.01)
(52) U.S. Cl. .................................. 341/156; 341/144
(58) Field of Classification Search ............... 341/155, 341/143, 172, 154, 118, 131, 144
See application file for complete search history.

(56) References Cited

U.S. PATENT DOCUMENTS

| | | | | |
|---|---|---|---|---|
| 4,614,936 A | | 9/1986 | Weidenbruch et al. ...... 340/347 |
| 4,937,575 A | * | 6/1990 | Kummer .................... 341/118 |
| 5,652,586 A | * | 7/1997 | Chuh et al. ................. 341/172 |
| 5,844,514 A | * | 12/1998 | Ringh et al. ................ 341/143 |
| 5,864,310 A | * | 1/1999 | Khorramabadi ............ 341/118 |
| 5,870,051 A | * | 2/1999 | Warburton et al. ......... 341/155 |
| 6,040,794 A | * | 3/2000 | Jaw ............................ 341/155 |
| 6,304,201 B1 | | 10/2001 | Moreland et al. ........... 341/154 |
| 6,509,771 B1 | | 1/2003 | Atallah et al. .............. 327/175 |
| 6,538,588 B1 | | 3/2003 | Bazarjani .................... 341/143 |
| 6,556,158 B1 | * | 4/2003 | Steensgaard-Madsen .... 341/131 |
| 6,653,962 B1 | * | 11/2003 | Gupta et al. ................ 341/155 |
| 6,674,381 B1 | * | 1/2004 | Gomez et al. .............. 341/143 |
| 6,707,492 B1 | | 3/2004 | Itani ......................... 348/229.1 |
| 6,750,796 B1 | | 6/2004 | Holloway et al. .......... 341/143 |
| 6,750,797 B1 | | 6/2004 | Gunther ...................... 341/144 |
| 6,788,240 B1 | | 9/2004 | Reyneri et al. ............. 341/159 |

OTHER PUBLICATIONS

Davis, "Dual successive approximation register in multichannel analog-to-digital interface," IBM Technical Disclosure Bulletin, vol. 27, No. 9, Feb. 1985, p. 5303-5305.
"Analog-to-Digital Converter", IBM Technical Disclosure Bulletin, vol. 10, No. 3, pp. 130-131, no date.

* cited by examiner

*Primary Examiner*—Jean Bruner Jeanglaude
(74) *Attorney, Agent, or Firm*—Van Leeuwen & Van Leeuwen; Thomas E. Tyson (57) ABSTRACT

A system and method for programmable high precision quantization of analog variable is provided. A signal conversion circuit includes a digital switch subtractor, an ADC, and a counter/adder. During the ADC's first sampling stage, the digital switch subtractor activates a bypass switch that allows the ADC to sample an original analog input signal and generate a first digital value using the original analog input signal. During the ADC's second sampling stage, the digital switch subtractor configures resistor network switches based upon the first digital value, thereby creating a voltage drop across the resistor network when the original analog input signal is applied. As a result, the digital switch subtractor's output is a modified analog signal, which the ADC samples and generates a second digital value. The counter/adder combines the first digital value and the second digital value to produce a digital output that a computer system processes.

19 Claims, 6 Drawing Sheets

SYSTEM AND METHOD FOR PROGRAMMABLE HIGH PRECISION QUANTIZATION OF ANALOG VARIABLE

BACKGROUND OF THE INVENTION

1. Technical Field

The present invention relates in general to a system and method for programmable high precision quantization of analog variable. More particularly, the present invention relates to a system and method for using a double sampling analog to digital converter's (ADC's) first digital value to configure an inline resistor network that, as a result, provides a modified analog signal to the ADC for generating a second digital value.

2. Description of the Related Art

Computing devices are used to interpret and/or manipulate "real-world" signals, such as visual or audio signals. Real-world signals are analog by nature due to their inherent characteristics. Computing devices, however, are designed to process digital signals. When a computing device receives an analog signal, the computing device uses signal conversion circuitry to convert the analog signal to a digital signal. In turn, the computing device then interprets and/or manipulates the digital signal.

Typical analog to digital conversion circuitry is designed using a double-sampling approach. A double-sampling circuit includes an analog to digital converter (ADC) and a feedback loop that includes a digital to analog converter (DAC). The double sampling circuit samples an analog signal a first time in order to determine the most significant bits (MSBs) of a digital output's value. The MSBs are fed back to the DAC, which converts the MSBs to an analog feedback signal, which is subtracted from the original analog signal. The double sampling circuit then samples the difference between the original analog signal and the analog feedback signal to determine the least significant bits (LSBs) of a digital output's value.

The double-sampling approach results in high precision analog to digital conversion values. A challenge found, however, is that this approach requires a high-precision, high cost, digital to analog converter in order to effectively provide an accurate analog feedback signal. A high-precision digital to analog converter may account for as much as 90% of the total cost of an analog to digital conversion circuit design.

What is needed, therefore, is a system and method for providing a high-precision analog to digital conversion circuitry without using a high precision digital to analog converter.

SUMMARY

It has been discovered that the aforementioned challenges are resolved by a system and method to use a double sampling analog to digital converter's (ADC's) first digital value to configure an inline resistor network that, as a result, provides a modified analog signal to the ADC. In turn, the ADC uses the modified analog signal to generate a second digital value. A counter/adder combines the first digital value and the second digital value to generate a digital output, which a computer system processes.

A signal conversion circuit includes a digital switch subtractor, an ADC, and a counter/adder. The digital switch subtractor includes a switch controller, a resistor network, and switches that correspond to particular resistors that are included in the resistor network. The switch controller selects a switch configuration based upon the ADC's first digital value, and activates or deactivates particular switches based upon the selected switch configuration. The functionality of the switch controller may be implemented in hardware (e.g., logical gates), software, or firmware (e.g., microcontroller).

During the ADC's first sampling stage, the switch controller activates a switch that bypasses the resistor network. By doing so, an original analog signal passes through the digital switch subtractor without modification. The ADC samples the digital switch subtractor's output, which is the same value as the original analog signal, and generates a first digital value. The first digital value includes the most significant bits (MSBs) of a digital output's value. For example, if the analog signal is 4.25 volts, the first digital value may correspond to a value of 4.0 volts. The ADC provides the first digital value to the counter/adder, which it stores in MSB locations.

For the second sampling stage, the counter/adder provides the first digital value to the digital switch subtractor's switch controller. In turn, the switch controller deactivates the bypass switch and selects a switch configuration that corresponds to the first digital value. Consequently, the switch controller activates one or more of the switches based upon the selected switch configuration in order to create an appropriate voltage drop across the resistor network.

As a result, since the resistor network is inline with the analog signal, the resistor network voltage drop is subtracted from the original analog signal. Using the example described above, since the first digital value corresponds to a value of 4.0 volts, the switch controller configures the switches to generate a 4.0V voltage drop across the resistor network when the analog signal is applied and, therefore, the digital switch subtractor's output equals the remaining 0.25 volts of the original analog signal (4.25V–4.0V).

After the switch controller configures the switches, the ADC samples the digital switch subtractor's output and generates a second digital value. The second digital value includes the least significant bits (LSBs) of a digital output's value. The counter/adder combines the MSBs and the LSBs to generate the digital output that a computer system processes.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
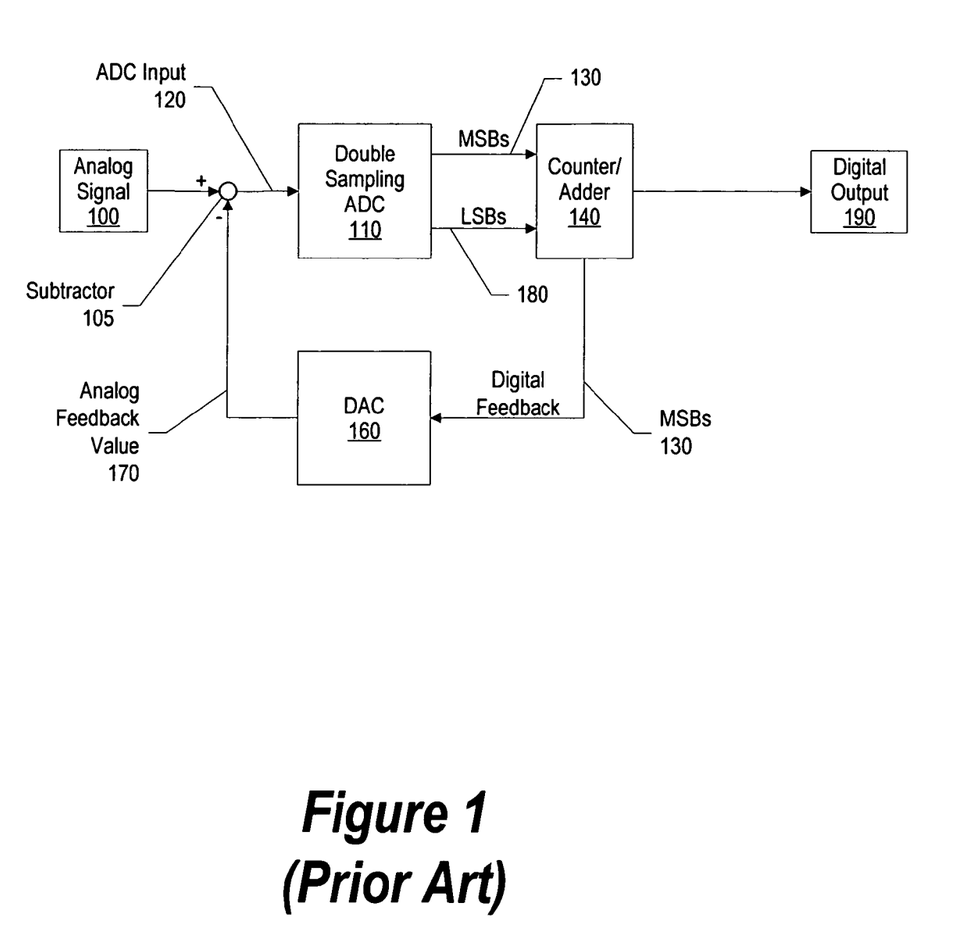
FIG. 1 is a diagram showing a signal conversion circuit without the invention described herein that includes a feedback loop with a digital to analog converter (DAC)

FIG. 1 is a diagram showing a signal conversion circuit without the invention described herein that includes a feedback loop with a digital to analog converter (DAC). The signal conversion circuit shown in FIG. 1 includes analog to digital converter (ADC) 110, counter/adder 140, and digital to analog converter (DAC) 160. DAC 160 requires high precision in order to effectively provide an accurate feedback value in the signal conversion circuit's feedback loop.

The signal conversion circuit shown in FIG. 1 is a double sampling circuit that has a first sampling stage and a second sampling stage. Meaning, ADC 110 samples analog signal 100 a first time in order to generate a digital output's most significant bits (MSBs) and samples a net value of analog signal 100 and analog feedback value 170 a second time in order to generate the digital output's least significant bits (LSBs).

During the first sampling stage, DAC 160's output (analog feedback value 170) is 0 volts. As such, subtractor 105 passes analog signal 100 through to ADC input 120 without change. As one skilled in the art can appreciate, subtractor 105 may include an analog inverter and a comparator.

ADC 110 samples ADC input 120 and generates a first digital value (MSBs 130), which is stored in counter/adder 140. Counter/adder 140 provides MSBs 130 to DAC 160 as a digital feedback value. In turn, DAC 160 converts MSBs 130 to analog feedback value 170. For example, if analog signal 100 is 4.25 volts and the MSBs correspond to a value of 4.0 volts, DAC 160 generates a 4.0 volt signal for analog feedback value 170.

Continuing with this example, since ADC input 120 equals analog signal 100 minus analog feedback value 170, ADC input 120 becomes 0.25 volts. At this time, ADC 110 performs a second sample of ADC input 120 and produces a second digital value, which is LSBs 180. Counter/adder 140 combines MSBs 130 and LSBs 180 to generate digital output 190, which is provided to a computer system.

Figure 2:
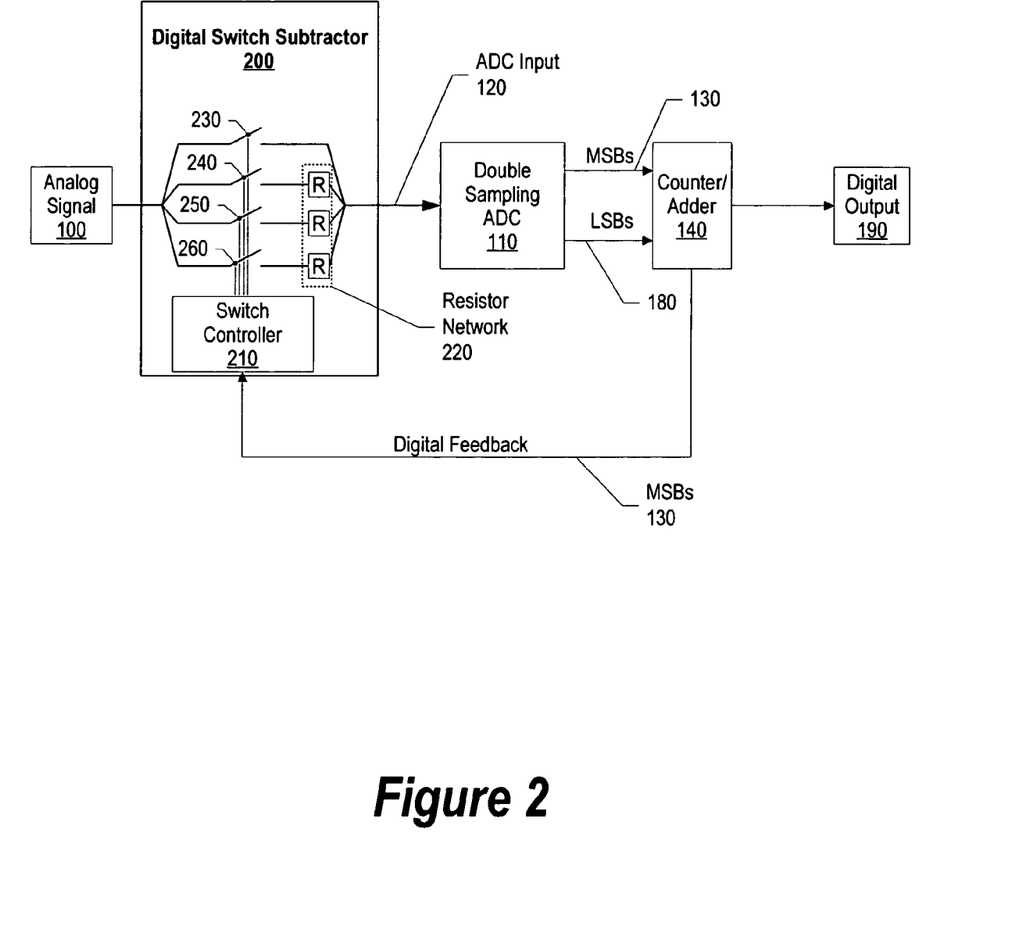
FIG. 2 is a diagram showing a signal conversion circuit that includes a digital switch subtractor.

FIG. 2 is a diagram showing a signal conversion circuit that includes a digital switch subtractor. The operation of the signal conversion circuit shown in FIG. 2 is similar to that shown in FIG. 1 from a double sampling operational perspective. However, FIG. 2's signal conversion circuit includes digital switch subtractor 200 in place if FIG. 1's DAC 160 and subtractor 105. By removing DAC 160 from the signal conversion circuit, the cost of the signal conversion circuit may be drastically reduced.

Digital switch subtractor 200 includes switch controller 210, resistor network 220, and switches 230–260. The functionality of switch controller 210 may be implemented in hardware (e.g., logical gates), software, or firmware (e.g., micro-controller). During ADC 110's first sampling stage, switch controller 210 activates switch 230, which bypasses resistor network 220. In turn, analog signal 100 passes through digital switch subtractor 200 without modification. As a result, ADC 110 samples ADC input 120, which is the same value as analog signal 100, and generates a first digital value (MSBs 130). MSBs 130 are stored in counter/adder 140.

For the second sampling stage, MSBs 130 is fed back to switch controller 210. In turn, switch controller 210 deactivates switch 230 and identifies a switch configuration that corresponds to MSBs 130. As a result, switch controller 210 activates one or more of switches 240–260 based upon the identified switch configuration in order to create an appropriate voltage drop across resistor network 220, which is subtracted from analog signal 100 (see FIG. 3 and corresponding text for further details regarding resistor network voltage drops). For example, if analog signal 100 is 4.25 volts and MSBs 130 corresponds to a value of 4.0 volts, switch controller 210 configures switches 240–260 such that when analog signal 100 is applied to resistor network 220, ADC input 120 equals 0.25 volts because a 4.0V voltage drop exists across resistor network 220.

After switch controller 210 configures switches 240–260, ADC 110 samples ADC input 120 and generates a second digital value (LSBs 180), which is stored in counter/adder 140. Counter/adder 140 combines MSBs 130 and LSBs 180 to generate digital output 190.

Figure 3:
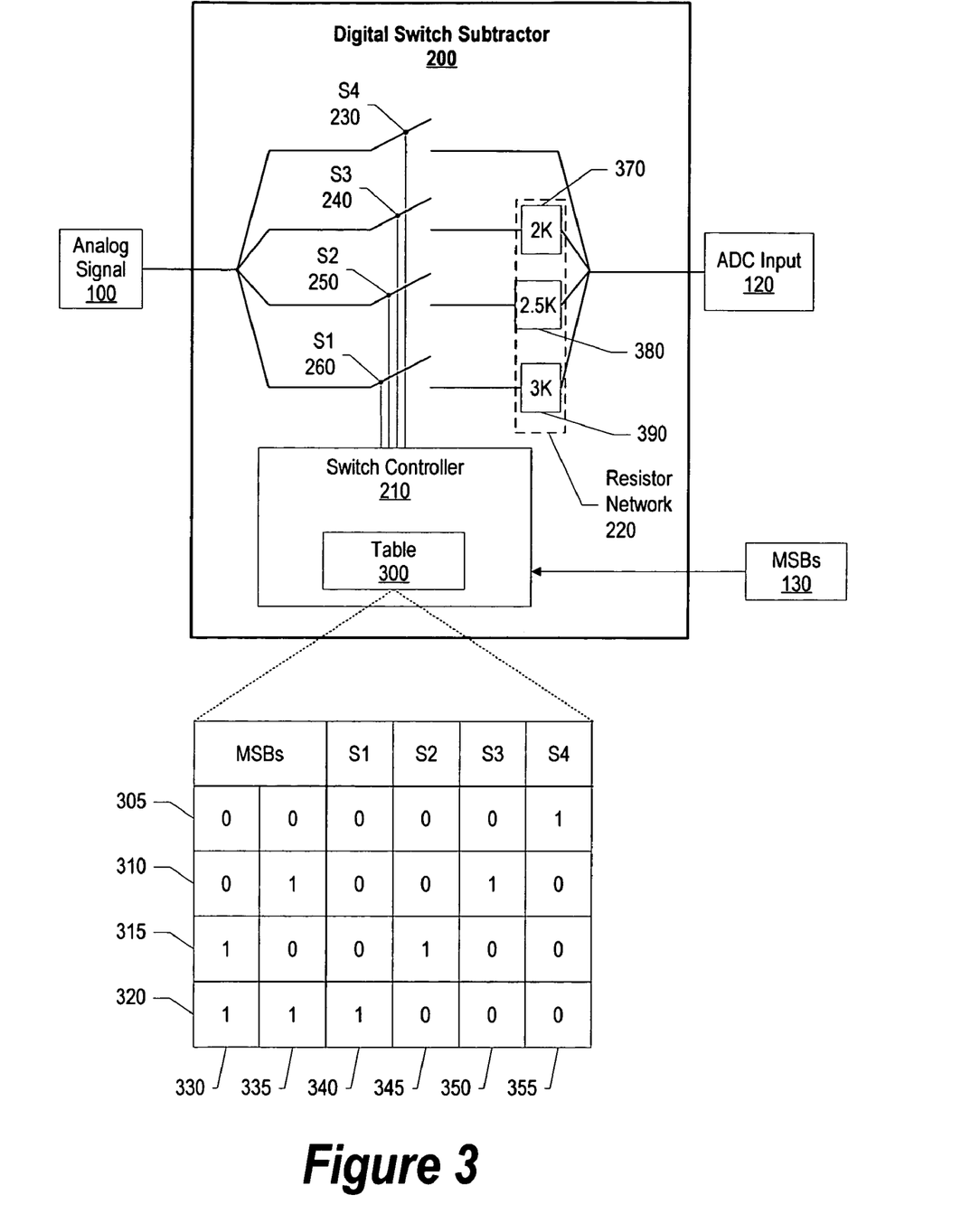
FIG. 3 is a diagram showing a digital switch subtractor referencing a lookup table in order to select a switch configuration that corresponds to a first digital value.

FIG. 3 is a diagram showing a digital switch subtractor referencing a lookup table in order to select a switch configuration that corresponds to a first digital value. The example shown in FIG. 3 shows that digital switch subtractor 200 uses a lookup table (table 300) to configure switches based upon most significant bits (MSBs) 130, which is the same as that shown in FIG. 2. As one skilled in the art can appreciate, a circuit designer may use other approaches to determine a switch configuration, such as an algorithm.

Resistor network 220 includes resistors 370 through 390. The example shown in FIG. 3 shows particular resistor values for resistors 370–390, which are 2.0K Ohms, 2.5K Ohms, and 3.0K Ohms, respectively. In this example, assuming that analog singal 100's current value is 2.0 mA, resistors 370–390 produce a voltage drop of 4.0 volts, 5.0 volts, and 6.0 volts, respectively.

When switch controller 210 receives MSBs 130, switch controller 210 uses table 300 to select a corresponding switch configuration. Table 300 includes rows 305–320. Each of the rows includes a particular switch configuration (columns 340–355) that corresponds to particular MSB values (columns 330–335). Row 305 includes a switch configuration when the MSB values are "00." As can be seen, row 305's switch configuration activates S4 230, which bypasses resistor network 220 altogether. Digital switch subtractor 200 uses this particular switch configuration during the ADC's first sampling stage that results in MSBs 130.

Rows 310–320 include switch configurations that digital switch subtractor 200 uses for the ADC's second sampling stage. Row 310 includes a switch configuration when the MSB values are "01." As can be seen, row 310's switch configuration activates S3 240, which feeds analog signal 100 through resistor 370. Using the example described above, resistor 370 generates a 4.0V voltage drop and, as a result, ADC input 120 is 4.0V less than analog signal 100.

Row 315 includes a switch configuration when the MSB values are "10." As can be seen, row 315's switch configuration activates S2 250, which feeds analog signal 100 through resistor 380. Using the example described above, resistor 380 generates a 5.0V voltage drop and, as a result, ADC input 120 is 5.0 volts less than analog signal 100.

Finally, row 320 includes a switch configuration when the MSB values are "11." As can be seen, row 320's switch configuration activates S1 260, which feeds analog signal 100 through resistor 390. Using the example described above, resistor 390 generates a 6.0V voltage drop and, as a result, ADC input 120 is 6.0 volts less than analog signal 100.

As one skilled in the art can appreciate, more or less resistors may be used in resistor network 220 in order to achieve a particular resistor network precision level. In addition, multiple switches may be activated simultaneously in order to achieve various voltage drop levels across resistor network 220.

Figure 4:
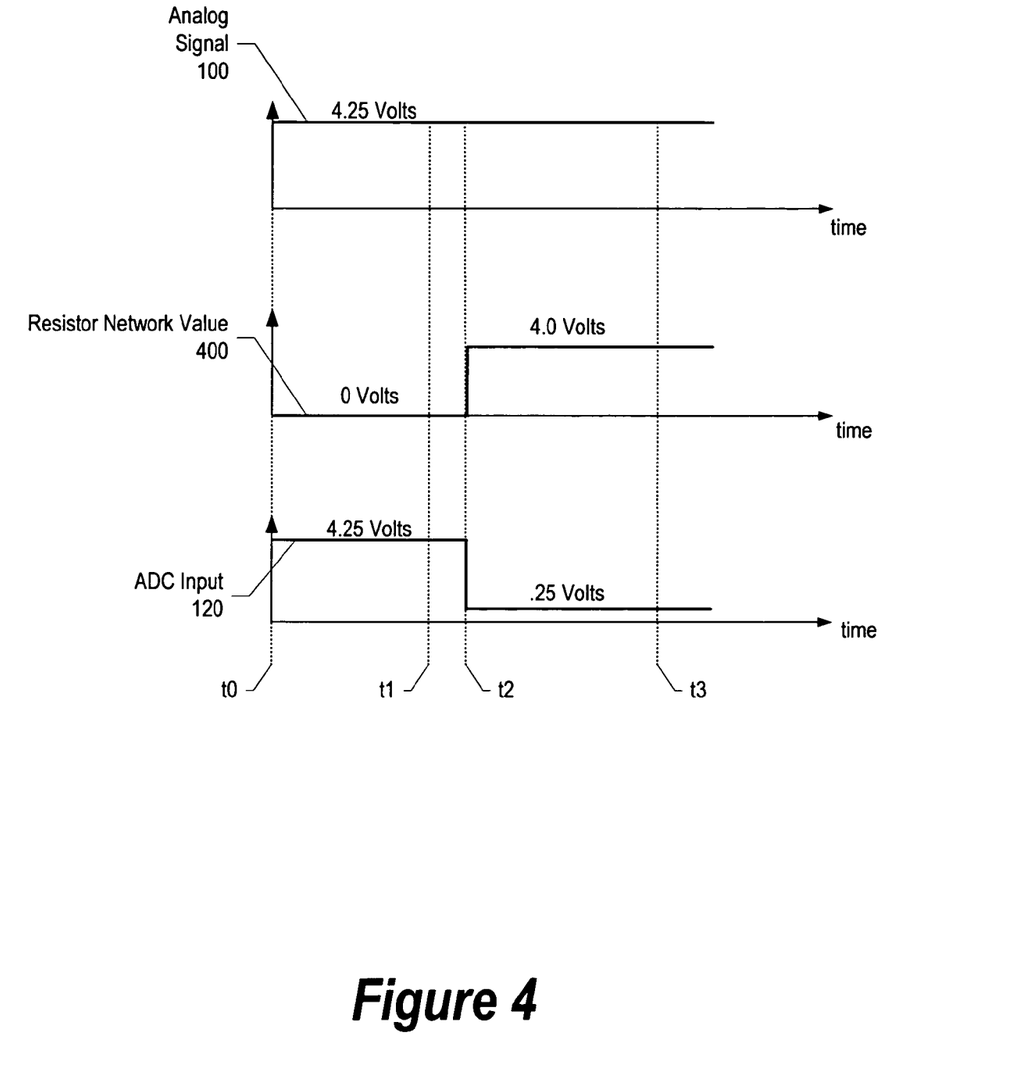
FIG. 4 is a diagram showing various voltage values at particular points in on signal conversion circuit's digital switch subtractor.

FIG. 4 is a diagram showing various voltage values at particular points on a signal conversion circuit's digital switch subtractor. FIG. 4 includes voltage values for analog signal 100, resistor network value 400, and ADC input 120. Analog signal 100 and ADC input 120 are the same as that shown in FIG. 2. Resistor network value 400 is a voltage drop value that results from applying analog signal 100 across resistor network 220 shown in FIG. 2. Resistor network value 400 is subtracted from analog signal 100 to produce ADC input 120.

At time t0, the digital switch subtractor configures switches to bypass its resistor network and pass analog signal 100 to the ADC without modification. As can be seen, at time t0, analog signal 100 and ADC input 120 are both 4.25 volts, while resistor network value 400 is 0 volts. At time t1, the ADC samples ADC input 120 and generates a first digital value that is used for a digital output's most significant bits (MSBs).

At time t2, the digital switch subtractor receives the first digital value and configures resistor network switches based upon the first digital value. As can be seen at time t2, the digital switch subtractor configures the resistor network switches such that resistor network value 400's value is 4.0 volts. Meaning, a 4.0V voltage drop exists on the resistor network. As a result, ADC input 120 decreases by 4.0 volts, which results in a value of 0.25 volts.

The ADC samples ADC input 120 at time t3 and generates a second digital value. A counter/adder combines the first digital value (MSBs) with the second digital value (LSBs) and produces a digital output.

Figure 5:
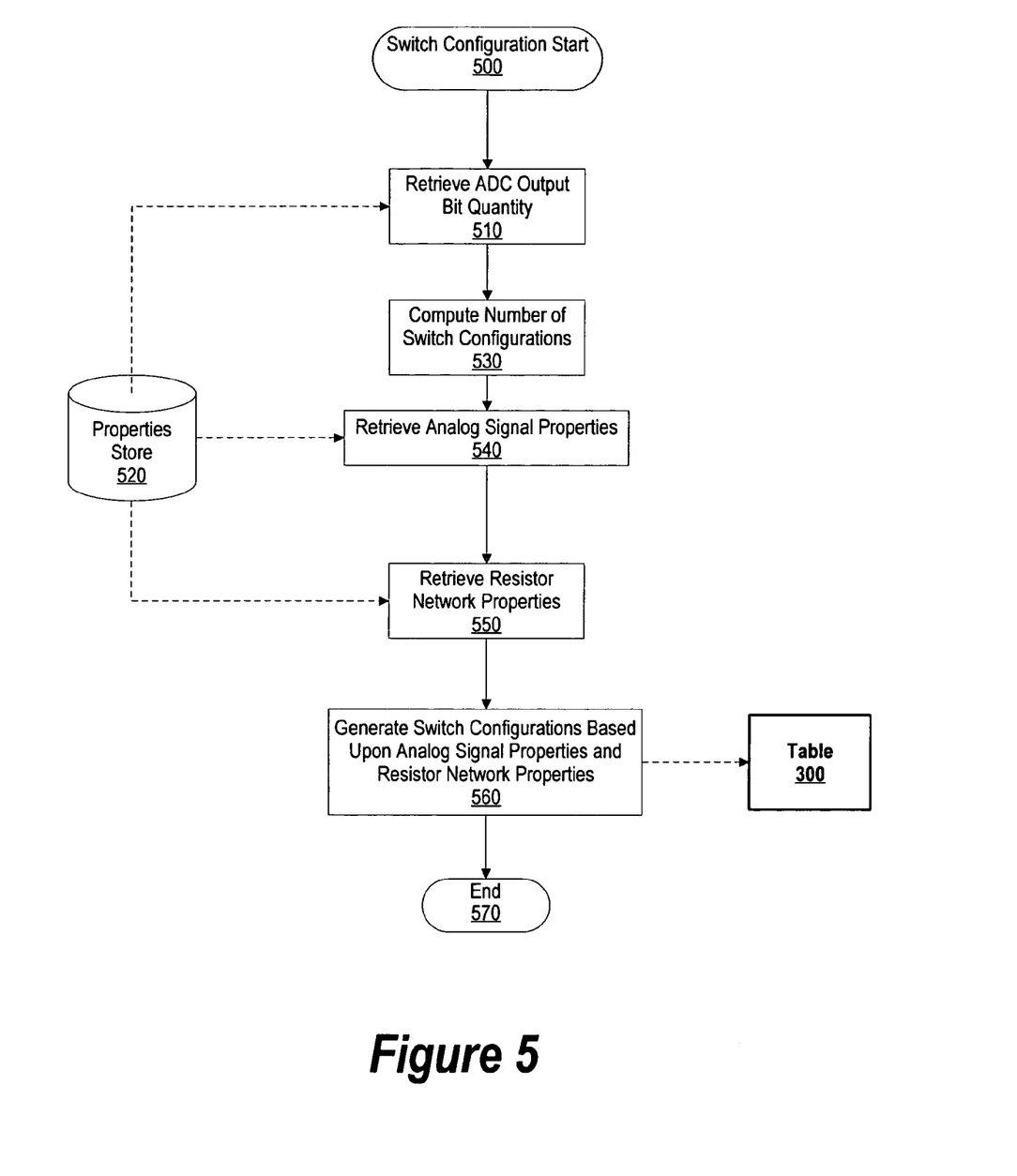
FIG. 5 is a flowchart showing steps taken in generating switch configurations based upon system parameters.

FIG. 5 is a flowchart showing steps taken in generating switch configurations based upon system parameters. System parameters may include the number of bits that an analog to digital converter (ADC) produces, analog signal properties (e.g., voltage and current ranges), and resistor network properties. Switch configuration generation starts at 500, whereupon processing retrieves an analog to digital (ADC) bit quantity from properties store 520 (step 510). For example, the ADC may produce a 2, 3, or 4-bit output value. Properties store 520 may be stored on a nonvolatile storage area, such as a computer hard drive.

At step 530, processing computes a number of switch configurations based upon the ADC output bit quantity. For example, if the ADC bit quantity is four bits, then the number of switch configurations is $2^4=16$. At step 540, processing retrieves analog signal properties from properties store 520. The analog signal properties may include an analog signal's expected maximum and minimum voltage levels as well as the input signal's expected current (I) value.

Processing retrieves resistor network properties from properties store 520 at step 550. The resistor network properties may include the number of resistors included in a resistor network along with their particular values. Using the analog signal properties and the resistor network properties, processing generates switch configurations and stores the switch configurations in table 300 (step 560). As one skilled in the art can appreciate, processing may use the formula V=IR to generate the switch configurations. In addition, processing may use an algorithm to combine resistor values in order to achieve desired voltage drops across the resistor network. Table 300 is the same as that shown in FIG. 3. Processing ends at 570.

Figure 6:
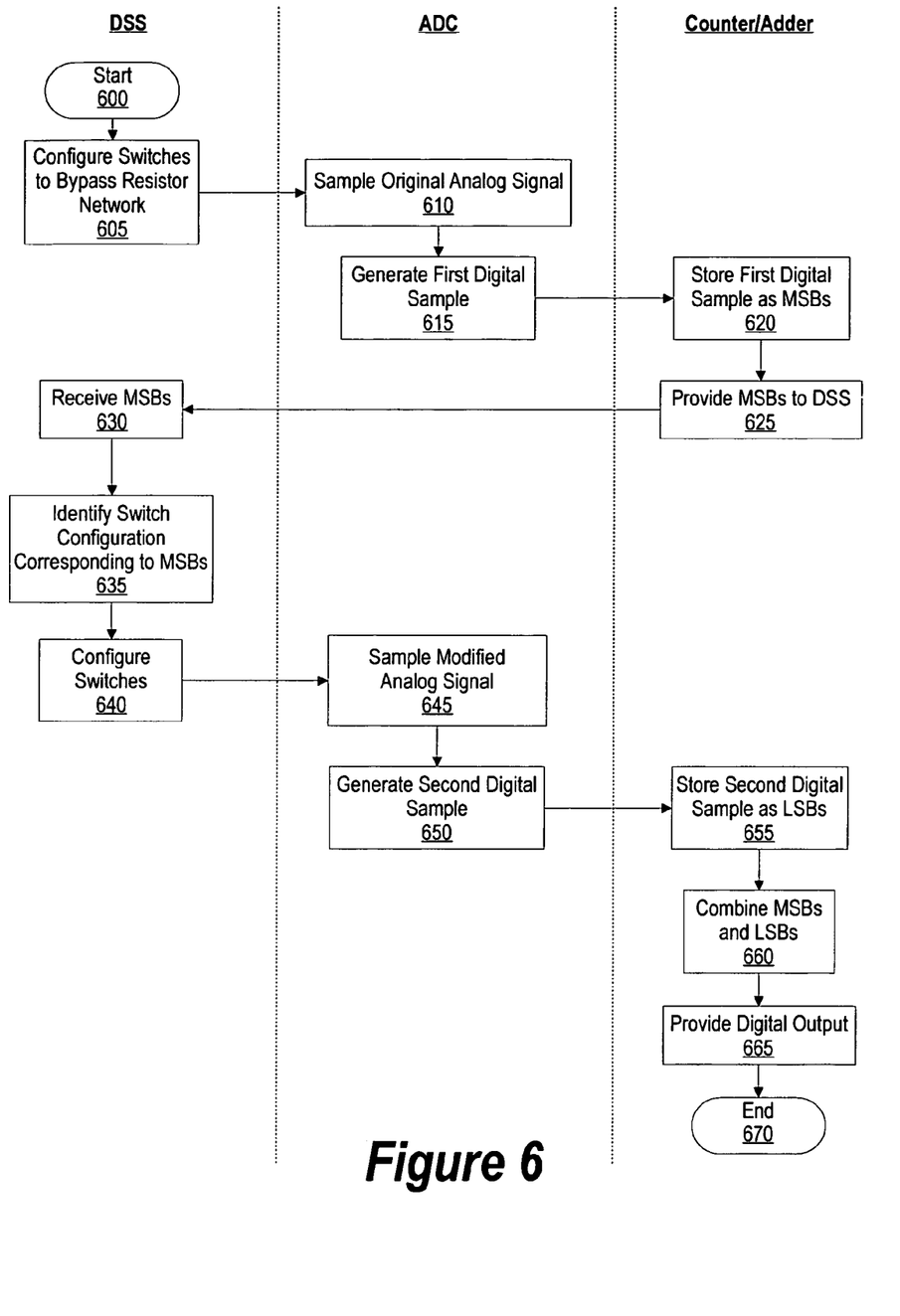
FIG. 6 is a flowchart showing steps taken in configuring a resistor network and generating a digital output from an analog signal.

FIG. 6 is a flowchart showing steps taken in configuring a resistor network and generating a digital output from an analog signal. A conversion circuit includes a digital switch subtractor, an analog to digital converter (ADC), and a counter/adder, such as that shown in FIG. 2. These devices work in conjunction with each other in order to produce a high precision digital output from an analog input.

Signal conversion processing commences at 600, whereupon the digital switch subtractor configures its switches to bypass its resistor network in order for the ADC to receive an unmodified analog signal (step 605). The ADC samples the unmodified analog signal at step 610 and generates a first digital sample, which is output to the counter/adder (step 615).

At step 620, the counter/adder stores the ADC's first digital sample as a digital output's most significant bits (MSBs). The counter/adder then provides the MSBs to the digital switch subtractor at step 625. The digital switch subtractor receives the MSBs at step 630 and identifies a switch configuration that corresponds to the received MSB values (step 635). For example, if the digital switch subtractor receives MSB values of "0110," the digital switch subtractor may identify a switch configuration that activates switches S3, S5, and S7. The digital switch subtractor configures the switches based upon the identified switch configuration at step 640.

At step 645, the ADC samples the digital switch subtractor's output value, which is a modified analog signal. The digital switch subtractor's modified analog signal is the original analog signal minus the voltage drop that is generated by the digital switch subtractor's resistor network (see FIG. 3 and corresponding text for further details). The ADC generates a second digital sample based upon the modified analog signal, and outputs the second digital sample to the counter/adder at step 650.

The counter/adder stores the second digital sample as the digital output's least significant bits (LSBs) at step 655. At step 660, the counter/adder combines the MSBs and LSBs to generate the digital output, and provides the digital output to a computer system at step 665. Processing ends at 670.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A system comprising:
   an analog to digital converter effective to receive an analog signal and generate a first digital value based upon the analog signal; and
   a digital switch subtractor effective to:
   receive the first digital value;
   select a switch configuration based upon the first digital value;
   activate one or more switches that correspond to a resistor network based upon the switch configuration; and
   provide a modified analog signal based upon the activated switches.

2. The system of claim 1 wherein the digital switch subtractor is coupled to the analog to digital converter.

3. The system of claim 1 wherein the analog to digital converter is further effective to provide a second digital value based upon the modified analog signal.

4. The system of claim 3 further comprising a counter/adder for providing a digital output value that includes the first digital value and the second digital value.

5. The system of claim 4 wherein the counter/adder provides the first digital value to the digital switch subtractor.

6. The system of claim 1 wherein the digital switch subtractor is further effective to:
   receive the analog signal;
   configure one or more of the switches such that the configuring bypasses the resistor network; and
   provide the analog signal to the analog to digital converter.

7. The system of claim 1 wherein each of the one or more switches corresponds to one or more resistors that is included in the resistor network.

8. The system of claim 1 wherein the digital switch subtractor includes the one or more switches, the resistor network, and a switch controller.

9. The system of claim 1 wherein the digital switch subtractor selects the switch configuration using a lookup table.

10. A computer-implemented method comprising:
    receiving, by an analog to digital converter, an analog signal;
    in response to the receiving, generating, by the analog to digital converter, a first digital value based upon the analog signal;
    selecting, by a digital switch subtractor, a switch configuration from a plurality of switch configurations based upon the first digital value;
    activating one or more switches that correspond to a resistor network based upon the switch configuration; and
    providing a modified analog signal to the analog to digital convertor based upon the activated switches.

11. The method of claim 10 wherein the analog to digital converter is further adapted to receive the modified analog signal and generate a second digital value based upon the modified analog signal.

12. The method of claim 11 further comprising: combining the first digital value and the second digital value, the combining resulting in a digital output.

13. The method of claim 10 further comprising:
    activating a bypass switch to bypass the resistor network; and
    in response to the activating, providing the analog signal to the analog to digital converter.

14. The method of claim 10 further comprising:
    retrieving analog signal properties that correspond to the analog signal;
    retrieving resistor network properties that correspond to the resistor network;
    retrieving analog to digital converter properties that correspond to the first digital value; and
    generating the plurality of switch configurations based upon the analog signal properties, the resistor network properties, and the analog to digital converter properties.

15. A computer program product stored on a computer operable media, the computer operable media containing instructions for execution by a computer, which, when executed by the computer, cause the computer to implement a method comprising:
    receiving, by an analog to digital convertor, an analog signal;
    in response to the receiving, generating, by the analog to digital convertor, a first digital value based upon the analog signal;
    selecting, by a digital switch subtractor, a switch configuration from a plurality of switch configurations based upon the first digital value;
    activating one or more switches that correspond to a resistor network based upon the switch configuration; and
    provide a modified analog signal to the analog to digital convertor based upon the activated switches.

16. The computer program product of claim 15 wherein the analog to digital converter is adapted to receive the modified analog signal and generate a second digital value based upon the modified analog signal.

17. The computer program product of claim 16 wherein the method further comprises combining the first digital value and the second digital value, the combining resulting in a digital output.

18. The computer program product of claim 15 wherein the method further comprises:
    activating a bypass switch to bypass the resistor network; and
    in response to the activating, providing the analog signal to the analog to digital converter.

19. The computer program product of claim 15 wherein the computer readable code is further effective to:
    retrieve analog signal properties that correspond to the analog signal;
    retrieve resistor network properties that correspond to the resistor network;
    retrieve analog to digital converter properties that correspond to the first digital value; and
    generate the plurality of switch configurations based upon the analog signal properties, the resistor network properties, and the analog to digital converter properties.

* * * * *